United States Patent [19]
Tan et al.

[11] Patent Number: 5,818,861
[45] Date of Patent: Oct. 6, 1998

[54] VERTICAL CAVITY SURFACE EMITTING LASER WITH LOW BAND GAP HIGHLY DOPED CONTACT LAYER

[75] Inventors: Michael R. Tan, Menlo Park; Shih-Yuan Wang, Palo Alto, both of Calif.

[73] Assignee: Hewlett-Packard Company, Palo Alto, Calif.

[21] Appl. No.: 684,649

[22] Filed: Jul. 19, 1996

[51] Int. Cl.⁶ ..................................................... H01S 3/19
[52] U.S. Cl. ............................................................ 372/46
[58] Field of Search ................................. 372/46, 96, 45, 372/44

[56] References Cited

U.S. PATENT DOCUMENTS 5,596,595  1/1997  Tan et al. .................................... 372/96

OTHER PUBLICATIONS

Cleo '96, Summaries of papers presented at the Conference on Lasers and Electro–Optics, Jun. 2–7, 1996, Anaheim, CA, vol. 9, 1996 Technical Digest Series, Conference Edition, p. 208.

*Primary Examiner*—James W. Davie
*Attorney, Agent, or Firm*—Jonathan B. Penn

[57] ABSTRACT

A contact structure for a vertical cavity surface emitting laser is described. The contact structure comprises a surface metal contact, a degeneratively doped layer of low bandgap material less than 200 Å thick, and a plurality of current spreading layers. The contact structure provides a low ohmic path between the metal contact and the active region of the vertical cavity surface emitting laser.

5 Claims, 1 Drawing Sheet

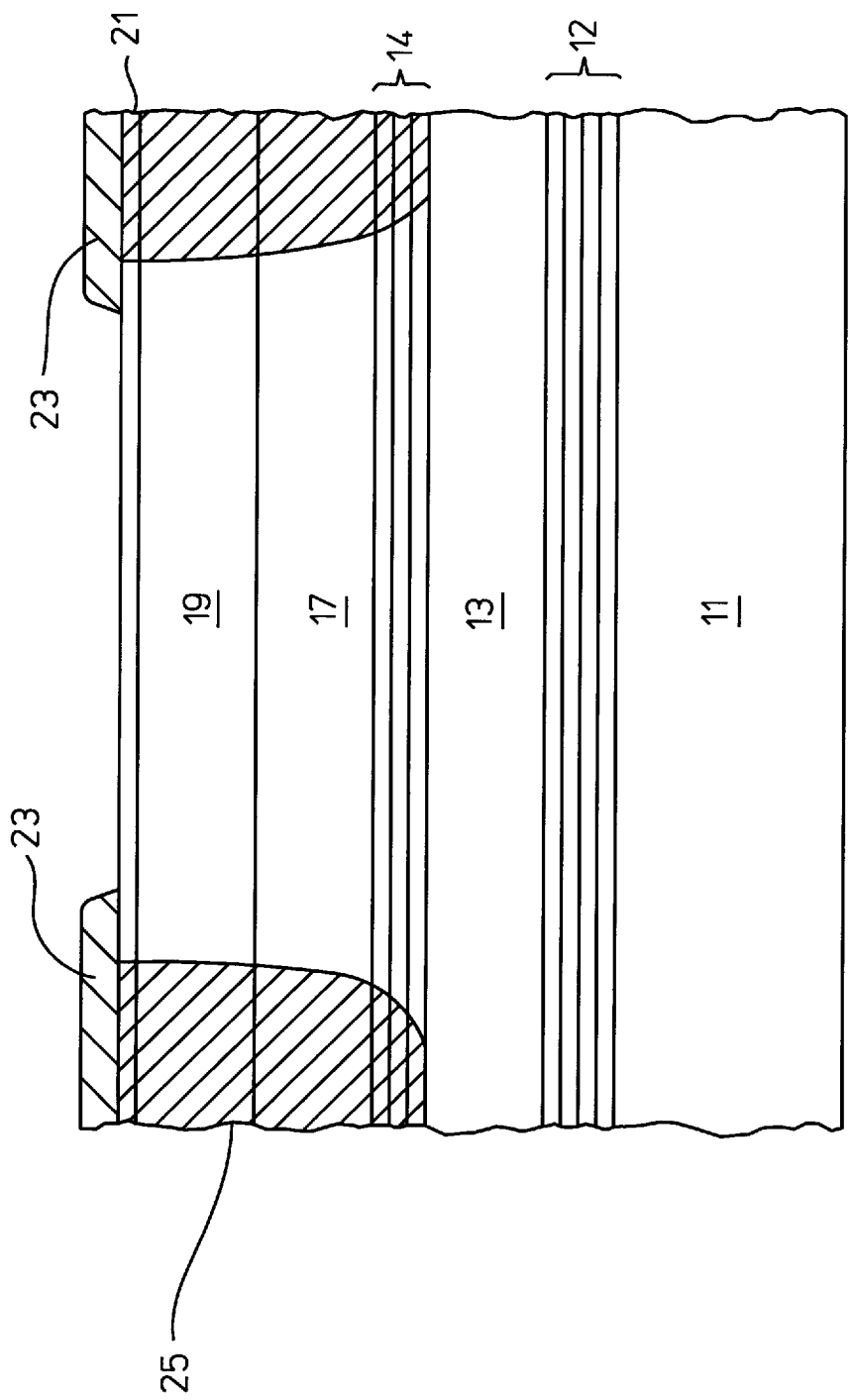
*The Figure*

VERTICAL CAVITY SURFACE EMITTING LASER WITH LOW BAND GAP HIGHLY DOPED CONTACT LAYER

FIELD OF THE INVENTION

This invention is in the field of light emitting semiconductor devices. In particular, it relates to vertical cavity surface emitting lasers ("VCSEL"s).

BACKGROUND OF THE INVENTION

VCSELs are known. They typically consist of a semiconductor substrate, a first Distributed Bragg Reflector ("DBR"), an active region, a second DBR overlying the active region, and upper contacts.

One problem with known VCSELs is that at shorter wavelengths (less than 780 nm), the DBR layers are made of different AlGaAs layers and it is difficult to make a good ohmic contact between the metal upper contact and the layers of AlGaAs in the DBR mirror.

Also, a VCSEL's output power is limited by its output resistance. The higher the resistance, the more the VCSEL is heat stressed. In known VCSELs, the resistance between the upper contacts and the rest of the VCSEL is significant, causing heat stress and limiting the power output of the VCSEL.

Creating ohmic contacts between the upper contact and the active region of VCSELs generating light at shorter wavelengths and reducing the output resistance of such devices would be valuable improvements to known VCSELs.

SUMMARY OF THE INVENTION

In a VCSEL constructed according to the first embodiment of the present invention, a thin, low bandgap material layer is placed immediately beneath the upper contact. The thin layer improves current injection from the metal upper contact into the semiconductor layers by reducing contact resistance. Between this thin layer and the VCSEL's upper DBR, there are a plurality of current spreading layers.

In a second embodiment of the present invention, those portions of the thin layer not overlain by the upper metal contact would be removed by etching or a similar process. This removal would allow more light to leave the VCSEL through its upper surface as the low bandgap layers absorb the emitted light.

These embodiment will now be described in detail with reference to the figure listed and described below.

BRIEF DESCRIPTION OF THE ILLUSTRATION

The FIGURE is a cross sectional view of a VCSEL which illustrates the first embodiment of the present invention.

DETAILED DESCRIPTION OF THE PREFERRED EMBODIMENT

VCSEL 10 is grown on substrate 11. Overlying substrate 11 is lower DBR 12, active region 13, and upper DBR 14. The design and fabrication of these layers and structures is known.

A plurality of current spreading layers are grown over upper DBR 14. In FIG. 1, these current spreading layers are number 17 and 19. The current spreading layers are highly doped to facilitate current spreading from upper contact 23 to active region 13 and approximately λ or λ/2 thick, which is adjusted to accommodate phase shift due to thin contact layer 21. In this first embodiment, these current spreading layers are fabricated from AlGaAs, the thickness of which is varied to either increase its reflectivity to the light generated by active region 13 or to increase its transmissivity to that same light. Layers whose thickness is an integer multiple of half the wavelength generated by active region 13 are transparent to the light generated by the active region, and layers whose thickness is an odd multiple of λ/4 reflect that same light, as they are in phase with upper DBR 14. Generally, layer 17 will be doped at a level approximating the doping concentration of upper DBR 14, roughly $5*10^{18}$, and layer 19 will be doped at a somewhat higher level, roughly $1*10^{19}$. Proper current spreading from metal contact 23 to active region 13 is facilitated by using either a proton implant 25 or a native oxide isolation area (not shown) to create a region of no electrical activity. Both proton implants and native oxide isolation areas are known.

Thin layer 21 is used to improve current injection from metal upper contacts 23 into the VCSEL by reducing the contact resistance. Layer 21 is a thin, approximately less than 200 Å thick, layer of GaAs, or, alternatively, InGaAs, degeneratively doped to approximately $5*10^{19}$ using such P-type dopants as carbon or zinc. Other dopants would be acceptable if the same high level of doping could be achieved without unacceptable levels of crystal damage. It is also possible to fabricate layer 21 from a plurality of thinner layers of InGaAs, the concentrations of In and Ga varying from layer to layer. With such a degeneratively doped layer between the surface contacts 23 and current spreading layers 17 and 19, contacts 23 can be made from a sandwich of Ti/Pt/Au. The Ti adheres well to the GaAs, the Pt acts as a barrier to AU migrating into the semiconductor layers and Au provides a very good electrical contact.

In a second embodiment, those portions of layer 21 which are not overlain by contact 23 are removed by etching or a similar process. To facilitate the etching process, an etch stop layer, placed between layers 21 and 19, could be used to insure that only the absorbing region is removed. Removing these portions of layer 21 has the effect of increasing the light extraction efficiency of VCSEL 10. The thickness of the other layers of the VCSEL remain the same in this embodiment, as does the operation of the VCSEL.

Because of the different lattice constants of the InGaAs layer, the thickness and In composition of the $In_xGa_{1-x}As$ layer is chosen so that the crystal does not relax. This is done by making the thickness of the InGaAs layer less than the critical thickness of InGaAs on GaAs.

What is claimed is:

1. In a vertical cavity surface emitting laser having at least a substrate, a lower distributed Bragg reflector, an active region generating light, and an upper distributed Bragg reflector, a contact structure comprising:

a plurality of current spreading layers overlying the upper distributed Bragg reflector, the current spreading layer closest to the upper distributed Bragg reflector having a dopant concentration approximately equal to that of the upper distributed Bragg reflector and successive current spreading layers having increasing dopant concentrations;

a degeneratively doped layer comprising a low bandgap material overlying the current spreading layers, the doping concentration of the current spreading layer underlying the degeneratively doped layer having a doping concentration approximately the same as the degeneratively doped layer; and a surface metal contact overlying portions of the degeneratively doped layer, the combination of the current spreading layers, the degeneratively doped layer, and the surface metal contact providing a low resistance current path from the surface contact to the active region.

2. The vertical cavity surface emitting laser of claim 1, wherein the current spreading layers comprise AlGaAs.

3. The vertical cavity surface emitting laser of claim 2, wherein the degeneratively doped layer comprises GaAs.

4. The vertical cavity surface emitting laser of claim 2, wherein the degeneratively doped layer comprises InGaAs.

5. The vertical cavity surface emitting laser of claim 1, wherein portions of the degeneratively doped layer not overlain by the surface metal contact are removed to allow additional light to escape.

* * * * *